US009755872B1

(12) United States Patent
Tertinek et al.

(10) Patent No.: US 9,755,872 B1
(45) Date of Patent: Sep. 5, 2017

(54) PULSE GENERATION USING DIGITAL-TO-TIME CONVERTER

(71) Applicant: Intel IP Corporation, Santa Clara, CA (US)

(72) Inventors: Stefan Tertinek, Linz (AT); Andreas Gebhard, Linz (AT); Silvester Sadjina, Linz (AT); Krzysztof Dufrene, Plesching (AT)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/251,142

(22) Filed: Aug. 30, 2016

(51) Int. Cl.
*H04L 27/20* (2006.01)
*H03K 19/21* (2006.01)
*H03L 7/099* (2006.01)

(52) U.S. Cl.
CPC ......... *H04L 27/2053* (2013.01); *H03K 19/21* (2013.01); *H03L 7/0991* (2013.01)

(58) Field of Classification Search
CPC .... H04L 27/2053; H03L 7/0991; H03K 19/21
USPC ......................................... 375/238, 239, 253
See application file for complete search history.

(56) References Cited

U.S. PATENT DOCUMENTS

| 8,994,573 B2* | 3/2015 | Henzler | ................ G04F 10/005 341/144 |
| 9,077,375 B2* | 7/2015 | Scholz | .................... H03M 1/66 |
| 2008/0014896 A1 | 1/2008 | Zhuo | |
| 2014/0370833 A1 | 12/2014 | Din | |
| 2015/0126145 A1 | 5/2015 | Casagrande | |
| 2015/0156044 A1* | 6/2015 | Madoglio | ............... H04L 27/22 375/219 |

OTHER PUBLICATIONS

Non Final Office Action dated Mar. 31, 2017 in connection with U.S. Appl. No. 15/188,267.
Zhang, Huajiang et al. A Harmonic-Rejection Mixer with Improved Design Algorithm for Broadband IEEE Radio Frequency Integrated Circuits Symposium. RMO3B-3. pp. 163-166.
Weldon, Jeffrey A. et al. "A 1.75-GHz Highly Integrated Narrow-Band CMOS Transmitter with Harmonic Mixers." IEEE Journal of Solid-State Circuits, vol. 36, No. 12, Dec. 2001. pp. 2003-2015.

* cited by examiner

*Primary Examiner* — Siu Lee
(74) *Attorney, Agent, or Firm* — Eschweiler & Associates, LLC

(57) ABSTRACT

Pulse generation circuitry includes edge generation circuitry and edge combination circuitry. The edge generation circuitry includes a first digital-to-time converter (DTC) configured to input a first phase signal that includes a first phase edge and a second phase signal that includes a second phase edge. The edge generation circuitry is configured to generate a first pulse edge signal comprising a first pulse edge at a selected location between the first phase edge and the second phase edge. The edge combination circuitry is configured to combine the first pulse edge signal and a second pulse edge signal including a second pulse edge to generate a pulse signal.

24 Claims, 7 Drawing Sheets

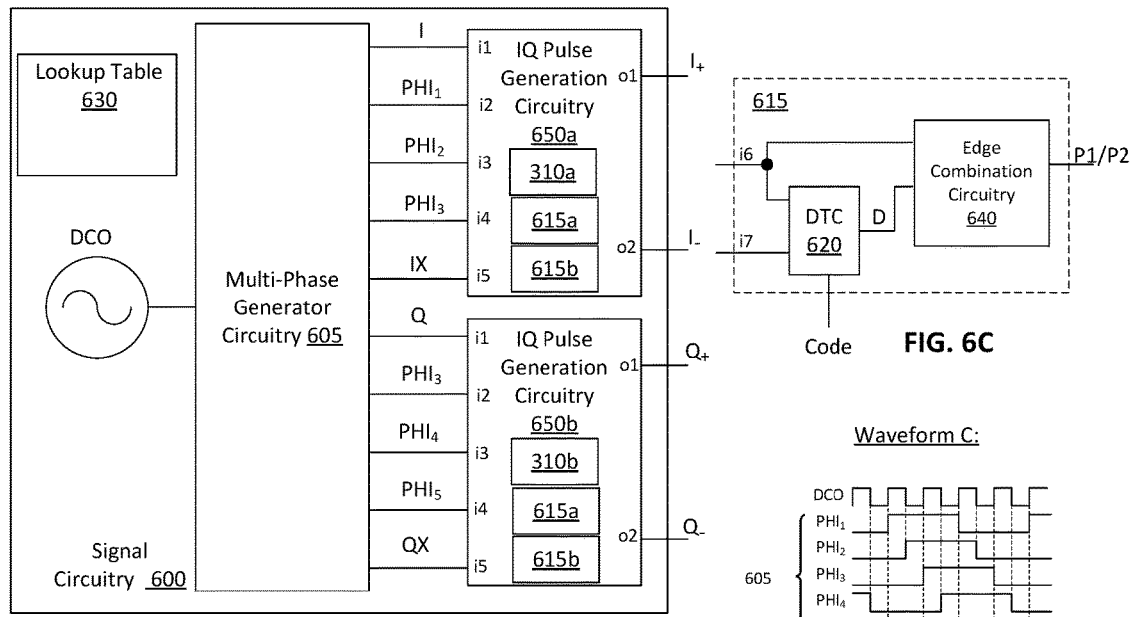
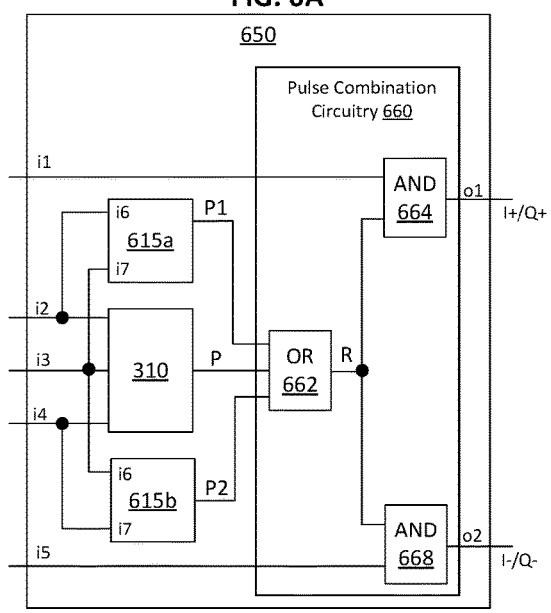
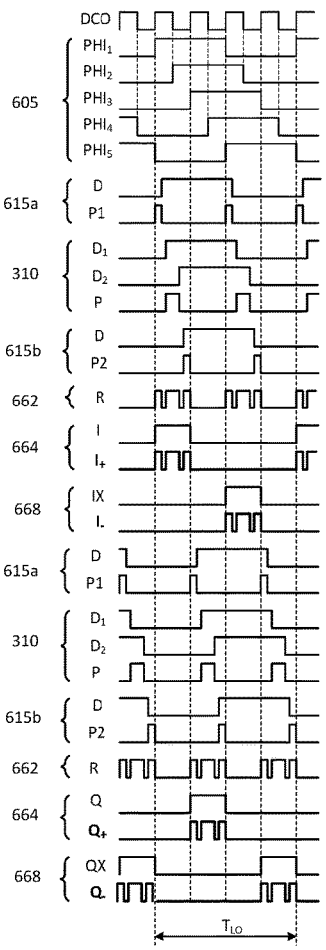
FIG. 6A
FIG. 6B
FIG. 6C
FIG. 6D

PULSE GENERATION USING DIGITAL-TO-TIME CONVERTER

FIELD

The present disclosure relates to the field of radio frequency (RF) transceivers and in particular to methods and apparatus for generating pulses having a desired width at a desired location within a duty cycle of a local oscillator.

BACKGROUND

In many RF transceiver applications, it is advantageous to have the ability to generate series of pulses with fine edge resolution over a wide range of frequencies. For example, in transceivers that utilize pulse width modulation (PWM) of the carrier signal to encode information, precisely controlling the timing and pulse width of the local oscillator signal improves the quality of the transmitted signal. In multiphase transceiver mixer circuits, gaps may be inserted in the local oscillator signal to suppress unwanted harmonics. While delay-locked loops (DLLs) have been used in some applications to generate signals with controlled pulse width and location, DLLs have limited accuracy and flexibility when designed to generate pulses with fine edge resolution and adjustable pulse width over a wide range of frequencies which makes them less suitable for use in generating local oscillator signals.

BRIEF DESCRIPTION OF THE DRAWINGS

Some examples of circuits, apparatuses and/or methods will be described in the following by way of example only. In this context, reference will be made to the accompanying Figures.

FIG. 6A illustrates one embodiment of local oscillator signal circuitry configured to generate harmonic suppressing local oscillator signals.

FIG. 6B illustrates one embodiment of pulse generation circuitry that can be included in the local oscillator signal circuitry of FIG. 6A.

FIG. 6C illustrates one embodiment of IQ pulse generation circuitry that can be included in the local oscillator signal circuitry of FIG. 6A.

FIG. 6D illustrates a timing diagram of the local oscillator signal circuitry of FIG. 6A.

DETAILED DESCRIPTION

In many signal processing applications it is necessary to generate pulse sequences having pulses of specific width at specific time locations. For example, the generation of local oscillator (LO) signals for use by mixer circuits or pulse width modulated (PWM) signals rely on circuitry that can generate pulses of precise width at precise locations. While delay-locked loops (DLLs) have been used in some applications to generate signals with controlled pulse width and location, DLLs have limited accuracy and flexibility when designed to generate pulses with fine edge resolution and adjustable pulse width over a wide range of frequencies which makes them less suitable for use in generating local oscillator signals.

In the following description, a plurality of details is set forth to provide a more thorough explanation of the embodiments of the present disclosure. However, it will be apparent to one skilled in the art that embodiments of the present disclosure may be practiced without these specific details. In other instances, well-known structures and devices are shown in block diagram form rather than in detail in order to avoid obscuring embodiments of the present disclosure. In addition, features of the different embodiments described hereinafter may be incorporated with each other, unless specifically noted otherwise.

While the methods are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

Figure 1:
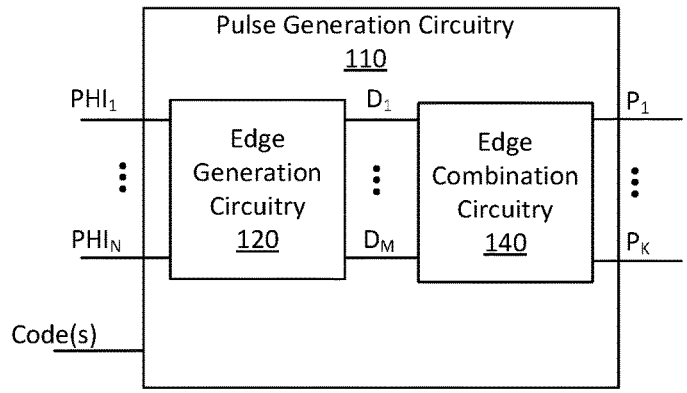
FIG. 1 illustrates an embodiment of pulse generation circuitry.

FIG. 1 illustrates one embodiment of pulse generation circuitry 110 that is configured to generate one or more pulse signals P based on one or more input codes and one or more phase signals PHI. For the purposes of this description, a pulse signal is a signal that includes one or more square pulses of selected width disposed at selected time locations in the signal. Each pulse includes a rising edge that defines a transition from a first signal value to a second signal value (i.e., low to high or high to low) and a falling edge that defines a transition back to the first signal value. The embodiments described herein will refer to pulses that have rising edge that transitions from a low amplitude value to a high amplitude value; however, pulses could also have a low amplitude value.

The pulse generation circuitry 110 inputs a plurality of phase signals PHI. The phase signals PHI are square wave or clock signals that have fixed relationship to one another. When the pulse generation circuitry 110 is being used to generate a local oscillator (LO) signal or PWM signal based on an oscillator signal having a period of $T_O$, successive phases may be shifted with respect to one another by $T_O/2$.

Figure 2A:
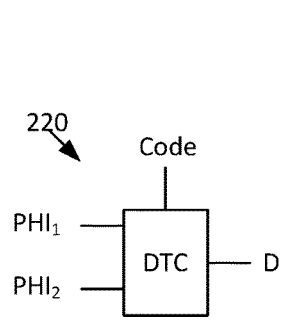
FIG. 2A illustrates an embodiment of edge generation circuitry that may be included in the pulse generation circuitry of FIG. 1.
Figure 2B:
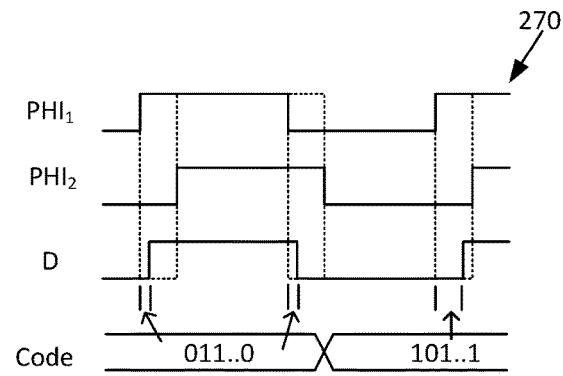
FIG. 2B illustrates a timing diagram of the edge generation circuitry of FIG. 2A.

The pulse generation circuitry 110 includes edge generation circuitry 120 and edge combination circuitry 140. The edge generation circuitry 120 is configured to generate at least one pulse edge signal D based on at least two phase signals PHI. The time location (hereinafter "location") of the pulse edge in the pulse edge signal is controlled based on the code. FIG. 2A illustrates one embodiment of edge generation circuitry 220 that includes a DTC that inputs two phases $PHI_1$ and $PHI_2$ as well as a control code. The control code is a digital word that specifies a relative position between phase edges in the phase signals at which the DTC will generate the edge D. As can be seen in the timing diagram 270 of FIG. 2B, a relatively low code [011 . . . 0] will cause the DTC to position the edges in the pulse edge signal D at a location closer to the phase edges in the first phase signal $PHI_1$, while a relatively high code [101 . . . 1] will cause the DTC to position the edges in the pulse edge signal D closer to the phase edges in the second phase signal $PHI_2$. In other words, a code of 0 will cause the DTC to output the first phase signal $PHI_1$ as the pulse edge signal D while a code having the maximum value [111 . . . 1] will cause the DTC to output the second phase signal $PHI_2$ as the pulse edge signal D.

In one embodiment, the DTC is a digitally controlled edge interpolator (DCEI) that operates based on the code to interpolate the phase edges to generate the pulse signal edge at a location that is specified by the code. The edge combination circuitry 140 is configured to combine two pulse edge signals D to generate each pulse signal P. As will be detailed below, in some embodiments, some of the pulse edge signals D that are input by the edge combination circuitry 140 are generated by the edge generation circuitry 120 while other pulse edge signals D input to the edge combination circuitry 140 correspond to phase signals PHI.

Figure 3A:
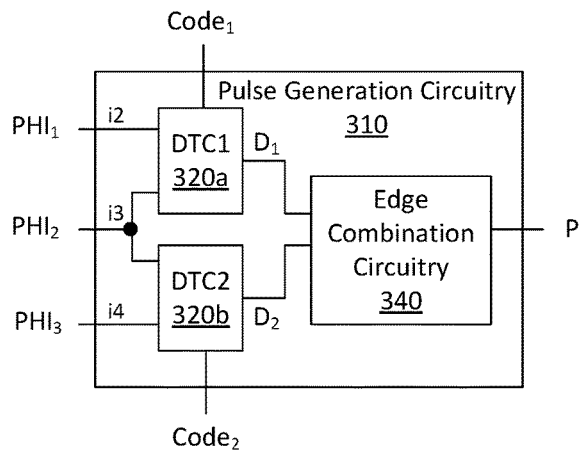
FIG. 3A illustrates one embodiment of pulse generation circuitry.
Figure 3B:
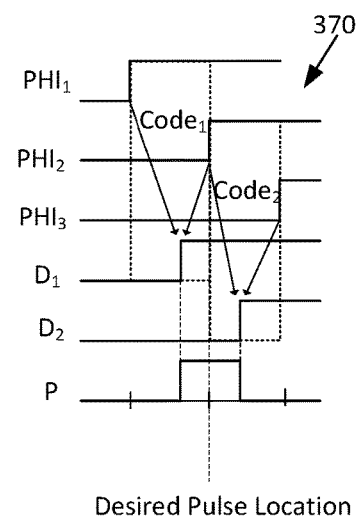
FIG. 3B illustrates a timing diagram of the pulse generation circuitry of FIG. 3A.

FIGS. 3A and 3B illustrate one embodiment of pulse generation circuitry 310 that is configured to generate a pulse signal P based on three phase signals $PHI_1$-$PHI_3$ and two codes. A first code, $code_1$, specifies the location of a rising edge of the pulse in the pulse sequence and the other code, $code_2$, specifies the location of the falling edge in the pulse. The pulse generation circuitry 310 includes two DTCs 320a, 320b that generate pulse edges. Each DTC 320a, 320b receives two input phases for interpolation. It can be seen in the timing diagram 370 of FIG. 3B, the first DTC 320a generates a pulse edge signal $D_1$ that defines the rising pulse edges of the pulse signal P and the second DTC 320b generates a pulse edge signal $D_2$ that defines the falling pulse edges of the pulse signal P. The edge combination circuitry 340 combines the two pulse edge signals $D_1$, $D_2$ to generate a pulse signal P having pulses at the desired locations and with the desired width. In one embodiment the edge combination circuitry includes exclusive OR (XOR) circuitry configured to perform a logical XOR operation on the pulse edge signals $D_1$, $D_2$ to generate the pulse signal P. As will be seen in FIGS. 4-8, using the pulse generation circuitry 310 together with multi-phase generator circuitry and additional pulse combination circuitry allows the generation of a wide range of LO and PWM signals.

FIG. 4 illustrates one embodiment of signal circuitry 400 that includes pulse generation circuitry 410 that generates pulse signals that are used to generate LO signals (I+, I−, Q+, Q−) for four different phases in a mixer 450 of a Cartesian transceiver. Mixers are used in transceiver front ends to increase the frequency of a baseband signal to RF for transmission by an antenna and also to decrease the frequency of a received RF signal to a baseband frequency. When receiving, a mixer inputs a signal received from an antenna $i_{RF}$ and a local oscillator signal having frequency fLO, and outputs a signal that corresponds to the received signal shifted to the baseband frequency. When transmitting, a mixer inputs a signal received from baseband processing components and outputs a signal corresponding to the baseband signal shifted to the local oscillator frequency fLO for transmission.

The mixer 450 inputs the four signal phase components I+, I−, Q+, and Q− from the signal circuitry 400. The mixer 450 includes a switch (e.g., transistor or CMOS) for each phase of the mixer (I+, I−, Q+, Q−). $Z_{BB}$ is the equivalent impedance of an amplifier at the drain port of each switch. To reduce interference, the LO signals generated by the signal circuitry 400 activate a single switch at a time. The standard 25% duty cycle LO signal (hereinafter "duty cycle signal") has a frequency of fLO and is a series of four non-overlapping pulses, each pulse with a duration of 25% of the period of the LO signal. One of the four pulses is provided to one of the gates, in turn, to convert all four phases of the RF signal $i_{RF}$ (referred to herein as the "information signal") to a baseband signal $i_{BB}$. When the standard 25% duty cycle LO signal is used by the mixer, the output of the mixer includes the even and odd harmonics of fLO which may lead to down-conversion of unwanted frequency content.

When switches, such as CMOS transistors, are used to implement a mixer circuit, harmonics of the fLO (e.g., 2fLO, 3fLO, and so on) are also generated. When, as in carrier aggregation or frequency division duplex systems, multiple receivers and/or transmitters are in operation simultaneously a harmonic of one of the subsystems (e.g., either receiver or transmitter) may be close to a frequency generated by another subsystem, resulting in interference. The harmonic response of a 25% duty cycle mixer contains even and odd harmonics of the local oscillator frequency. This may lead to down-conversion of unwanted signal contents. Further, one or more of the receiver mixer harmonics may down-convert an unwanted signal into the receiver's baseband signal. Harmonics of the different subsystems can couple with each other and produce new spur frequency content which may fall near the transmit frequency or transmit frequency harmonics or near an in-band blocker interference. Thus the newly generated spur frequency can down-convert interference into the baseband and disturb the desired receive signal. Other types of interference are possible during carrier aggregation. Harmonic crosstalk is produced by harmonics of passive mixers. In some situations, the crosstalk generates spurs due to coupling. Selective suppression of problematic harmonics can mitigate this type of interference.

The harmonics generated by mixers may be suppressed when the signal circuitry 400 is configured to provide an LO signal to the mixer 450 that is a pulse series having at least one gap during the duty cycle for each signal component. The arrangement of the series of pulses, the width or duration of the pulses, and the width or duration of the gap(s) are selected based on the harmonics to be suppressed. In this manner, the mixer is driven with a waveform that has no content at one or more selected harmonics to avoid harmonic down-mixing of unwanted signal into a receiver's baseband signal. When a 25% duty cycle is used, the benefits of having non-overlapping ON states of mixer switches are maintained while rejection or suppression of unwanted harmonics is obtained.

Figure 4A:
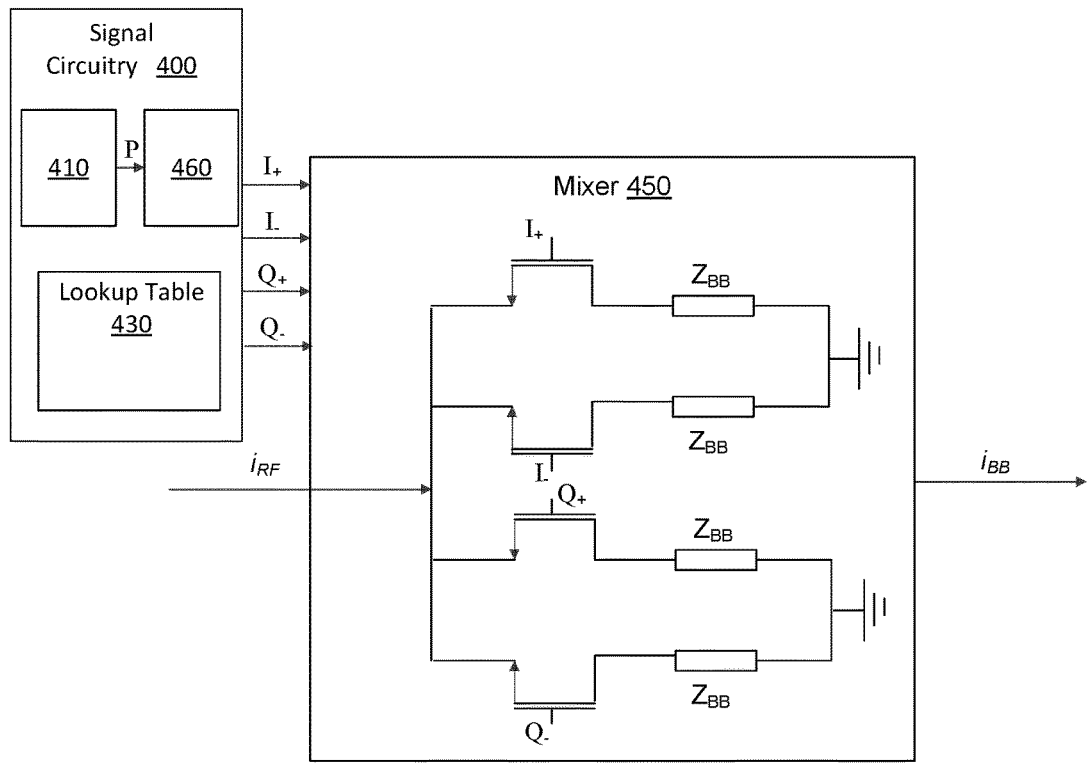
FIG. 4A illustrates a mixer and one embodiment of local oscillator signal circuitry configured to generate harmonic suppressing local oscillator signals.
Figure 4B:
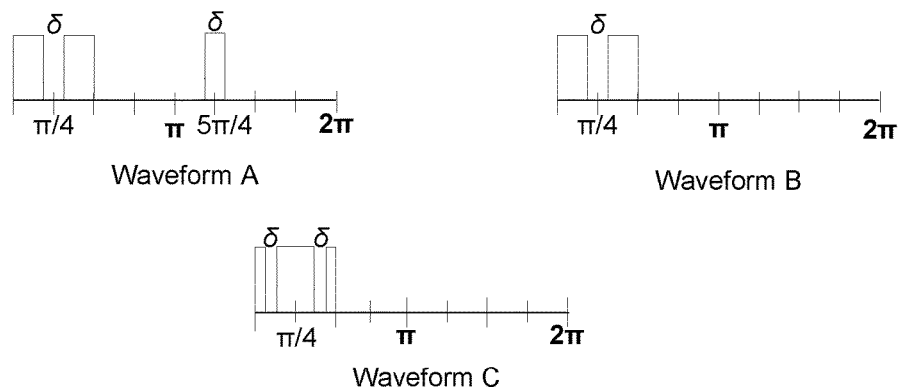
FIG. 4B illustrates three example local oscillator signal waveforms that suppress harmonics.

FIG. 4B illustrates three different harmonic suppressing LO signal waveforms. In waveform A a gap with a duration of δ is inserted in the middle of a standard 25% duty cycle pulse and a pulse having duration δ is added to the duty cycle signal at an offset of π from the gap. This waveform A provides the same energy as a standard duty cycle pulse while selectively suppressing harmonics by adjusting the gap duration δ as shown below in table 1.

TABLE 1

| Suppressed Harmonic | δ in % Duty Cycle | Change in Conversion Gain at Fundamental Frequency in dB |
| --- | --- | --- |
| 3rd | 3.83 | −3.6 |
| 5th | 22.28 | −1.7 |
| 7th | 15.93 | −9 |
| 9th | 9.83 | −17 |
| 13th | 8.57 | −4.1 |
| 15th | 7.43 | −9.3 |

The width δ may be calculated by setting the kth Fourier-coefficient of the waveform to zero and solving the nonlinear equation for δ. Waveform A can be used to reject a specific harmonic content in a 25% duty cycle mixer. For example, the suppression of the $3^{rd}$ harmonic in one mixer phase can be realized with the gap duration of δ=3.83% of duty cycle. Table 1 shows the δ value used to suppress specific harmonic content. The drop in the conversion gain compared to the standard 25% duty cycle pulse for each suppressed harmonic is also shown in Table 1.

In waveform B a gap with a duration of δ is inserted in the middle of a standard 25% duty cycle pulse while the pulse at the offset of π from the gap that is included in waveform A is not present in waveform B. The harmonic suppressing characteristics of waveform B as a function of gap duration δ are shown below in Table 2.

TABLE 2

| Suppressed Harmonic | δ in % Duty Cycle | Change in Conversion Gain at Fundamental Frequency in dB |
| --- | --- | --- |
| 3rd | 8.33 | −4.0 |
| 5th | NA | NA |
| 7th | 17.86 | −12.2 |
| 9th | 8.33 | −4.0 |
| 13th | 9.62 | −4.8 |
| 15th | 8.33 | −4.0 |

Table 2 shows that waveform B with a gap duration δ value of 8.33% of duty cycle suppresses the $3^{rd}$, $9^{th}$, and $15^{th}$ harmonic with only a 4 dB decrease in conversion gain. However, waveform B is not as effective at suppressing the $5^{th}$ and $7^{th}$ harmonic.

In waveform C two symmetrical gaps with duration of δ are inserted in a 25% duty cycle pulse. The gaps are spaced apart by a center pulse. In one embodiment, the center pulse has a duration of 2δ. The harmonic suppressing characteristics of waveform C as a function of gap duration δ are shown below in Table 3.

TABLE 3

| Suppressed Harmonic | δ in % Duty Cycle | Change in Conversion Gain at Fundamental Frequency in dB |
| --- | --- | --- |
| 5th | 4.54 | −4.0 |
| 7th | 3.25 | −2.8 |

In general, waveform A can be used to suppress the $3^{rd}$, $5^{th}$, or $13^{th}$ harmonic. Waveform B can be used to suppress the $3^{rd}$, $9^{th}$, $15^{th}$, $21^{st}$, and so on simultaneously using a gap duration of 8.33% of duty cycle. Waveform C can be used to reject $5^{th}$ or $7^{th}$ harmonic content.

Returning to FIG. 4A, the signal circuitry 400 includes lookup table 430 that stores code values mapped to the waveform type and δ value that will be generated by the pulse generation circuitry 410 when controlled by the particular code value. As will be described in more detail with respect to FIGS. 5-8, the lookup table 430 may also store waveform types mapped to pulse combination logic that controls operation of pulse combination circuitry 460 that combines pulse signals from the pulse generation circuitry 410 to generate a desired LO signal or PWM signal.

Figure 5A:
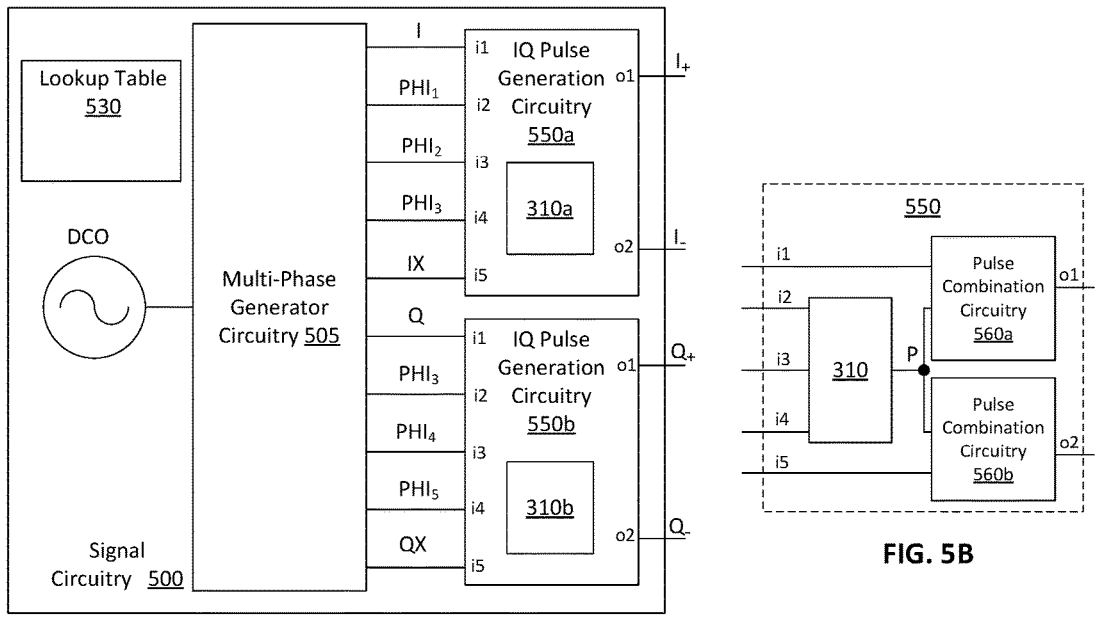
FIG. 5A illustrates one embodiment of local oscillator signal circuitry configured to generate harmonic suppressing local oscillator signals.

FIG. 5A illustrates one embodiment of signal circuitry 500 configured to generate a four phase LO signal for use by a mixer in a Cartesian transceiver (e.g., mixer 450 of FIG. 4A). The signal circuitry 500 is capable of generating any number of different LO signal waveforms, including waveform A and waveform B (and with some modification waveform C as will be shown in FIGS. 6A-6C). The signal circuitry 500 includes a digitally controlled oscillator (DCO) that generates a clock signal having period To. Multi-phase generator circuitry 505 generates phase signals $PHI_1$-$PHI_5$ from the clock signal as well as duty cycle signals I, IX, Q, QX that correspond to non-overlapping 25% duty cycle pulses that are each associated with one phase of the mixer. Each successive phase $PHI_1$-$PHI_5$ is shifted from a previous phase by half an oscillator period To/2. In one embodiment, the multi-phase generator circuitry 505 includes one or more counters or flip flops configured to generate the phase signals and duty cycle signals from the oscillator signal.

The signal circuitry 500 includes two IQ pulse generation circuitries 550a, 550b. A first IQ pulse generation circuitry 550a generates local oscillator signals I+ and I− while a second IQ pulse generation circuitry 550b generates local oscillator signals Q+ and Q−. The local oscillator signals I+, I−, Q+, and Q− are input to the mixer as shown in FIG. 4A. For the sake of simplicity, a detailed description of a single IQ pulse generation circuitry 550 will be provided. It is to be understood that the other IQ pulse generation circuitry 550 functions in an analogous manner, using different phase signals and duty cycle signals as inputs.

Figure 5C:
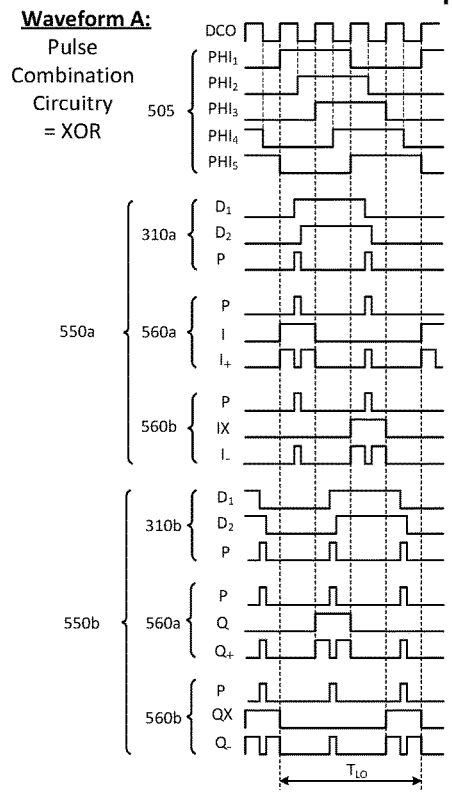
FIG. 5C illustrates two timing diagrams of two embodiments of the local oscillator signal circuitry of FIG. 5A.
Figure 5C:
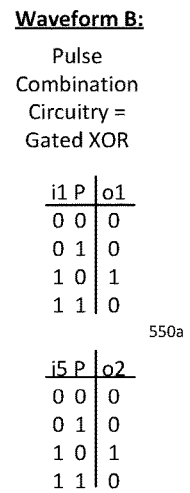
Figure 5B:
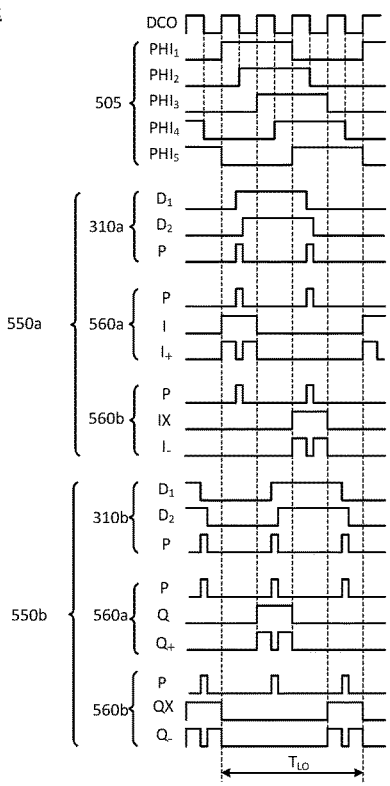
FIG. 5B illustrates one embodiment of IQ pulse generation circuitry that can be included in the local oscillator signal circuitry of FIG. 5A.

FIG. 5B illustrates one embodiment of the IQ pulse generation circuitry 550. The IQ pulse generation circuitry 550 includes the pulse generation circuitry 310 illustrated in FIG. 3A. Recall that pulse generation circuitry 310 inputs a first code that locates a rising edge of the pulse in the pulse signal P and a second code that locates a falling edge of the pulse in the pulse signal P. The first code is input to a first DTC that outputs a first pulse edge signal D1 and the second code is input to a second DTC that outputs a second pulse edge signal D2. The width of the pulses in the pulse signal P can thus be controlled by using appropriately selected codes. The width of the pulse output by the pulse generation circuitry corresponds to the value of δ in the waveforms A and B. A lookup table 530 stores code pairs mapped to waveform values. Signal circuitry 500 is configured to access the lookup table 530 to retrieve codes for a selected waveform. For example, codes that will generate pulses having a width of 8.33% of the duty cycle may be stored in the lookup table 530 and mapped to waveform A.

The IQ pulse generation circuitry 550 includes pulse combination circuitry 560a, 560b. Each pulse combination circuitry combines one duty cycle signal with the pulse signal P from the pulse generation circuitry 310 to generate an LO signal characterized by the selected waveform. For example, the pulse combination circuitry 560a combines the I duty cycle signal with the pulse signal P to generate the I+LO signal that is provided to the I+ switch in the mixer. The logical operation performed by the pulse combination circuitry determines the placement of the gaps and pulses having duration δ in the waveforms A and B.

FIG. 5C illustrates timing diagrams for signal circuitry 500 when waveform A has been selected as compared to when waveform B has been selected. When waveform A is selected, the pulse combination circuitries 560a, 560b perform an XOR operation on the duty cycle signal (e.g., I, IX, Q, QX) and the pulse signal P to generate the LO signal. It can be seen in the timing diagram for waveform A that the five phase signals generated by multi-phase generator circuitry 505 are delayed by one half the oscillator period from one another. The pulse signal P output by the pulse generation circuitry 310a includes a first pulse disposed in a location that corresponds to the δ width gap in the LO signal I+ and a second pulse that corresponds to the offset pulse in the LO signal I+ according to waveform A. When the pulse combination circuitry 560a combines the pulse signal P output by pulse generation circuitry 310a with the duty cycle signal for I based on XOR logic, the LO signal I+ is characterized by waveform A. Thus, the logical operation XOR is mapped to waveform A in the lookup table 530 so that when waveform A is desired, the pulse combination circuitry 560 is adapted to perform an XOR operation.

When waveform B is selected, the pulse combination circuitries 560a, 560b perform a logical operation summarized in the logic table in FIG. 5C on the duty cycle signal (e.g., I, IX, Q, QX) and the pulse signal P to generate the LO signal. For the purposes of this description, the logical operation summarized in the logic table in FIG. 5C will be called "gated XOR" because, using the duty cycle signal as the gating signal, when the duty cycle signal has a value of 1, then the duty cycle signal and the pulse signal P are XORed.

It can be seen in the timing diagram for waveform B that the five phase signals generated by multi-phase generator circuitry 505 are delayed by one half the oscillator period from one another. The pulse signal P output by the pulse generation circuitry 310a includes a first pulse disposed in a location that corresponds to the δ width gap in the LO signal I+ and a second pulse that corresponds to the offset pulse in the LO signal I+ according to waveform A. When the pulse combination circuitry 560a combines the pulse signal P output by pulse generation circuitry 310a with the duty cycle signal for I based on the gated XOR logic of the logic table in FIG. 5C, the second pulse in the pulse signal D is suppressed and the LO signal I+ is characterized by waveform B. Thus, the gated XOR operation may be mapped to waveform B in the lookup table 530 so that when waveform B is desired, the pulse combination circuitry 560 is adapted to perform a logical operation that corresponds to a gated XOR operation on the duty cycle signal and the pulse signal using the duty cycle signal as the gating signal.

FIG. 6A illustrates one embodiment of signal circuitry 600 configured to generate a four phase LO signal for use by a mixer in a Cartesian transceiver (e.g., mixer 450 of FIG. 4A). The signal circuitry 600 is an adaptation of signal circuitry 500 that is capable of generating LO signals characterized by waveform C. The signal circuitry 600 includes a digitally controlled oscillator (DCO) that generates a clock signal having period To. Multi-phase generator circuitry 605 generates phase signals $PHI_1$-$PHI_5$ from the clock signal as well as duty cycle signals I, IX, Q, QX that correspond to non-overlapping 25% duty cycle pulses that are each associated with one phase of the mixer. Each successive phase $PHI_1$-$PHI_5$ is shifted from a previous phase by half an oscillator period To/2. In one embodiment, the multi-phase generator circuitry 605 includes one or more counters or flip flops configured to generate the phase signals and duty cycle signals from the oscillator signal.

The signal circuitry 600 includes two IQ pulse generation circuitries 650a, 650b. A first IQ pulse generation circuitry 650a generates local oscillator signals I+ and I− while a second IQ pulse generation circuitry 650b generates local oscillator signals Q+ and Q−. The local oscillator signals I+, I−, Q+, and Q− are input to the mixer as shown in FIG. 4A. For the sake of simplicity, a detailed description of a single pulse generation circuitry 650 will be provided. It is to be understood that the other IQ pulse generation circuitry 650 functions in an analogous manner, using different phase signals and duty cycle signals as inputs.

FIG. 6B illustrates one embodiment of the IQ pulse generation circuitry 650. The IQ pulse generation circuitry 650 includes the pulse generation circuitry 310 illustrated in FIG. 3A as well as two modified pulse generation circuitries 615a, 615b that are illustrated in FIG. 6C. Recall that pulse generation circuitry 310 inputs a first code that controls a rising edge of the pulse in the pulse signal P and a second code that controls a falling edge of the pulse in the pulse signal P. The first code is input to a first DTC that outputs a first pulse edge signal D1 and the second code is input to a second DTC that outputs a second pulse edge signal D2. The width of the pulses in the pulse signal P can thus be controlled by using appropriately selected codes. The width of the pulse output by the pulse generation circuitry corresponds to the width of the center pulse in the waveform C.

The modified pulse generation circuitry 615 shown in FIG. 6C operates in a similar manner as the pulse generation circuitry 310 except that instead of using a second DTC to generate one of the pulse edge signals, one of the two phase signals input to the first DTC (e.g., $PHI_1$ in FIG. 3A) is used as the second pulse signal. Edge combination circuitry 640 performs an XOR operation on the pulse edge signal D and the phase signal PHI to generate a modified pulse signal P1 (or P2). Note that the modified pulse generation circuitry 615 can be implemented using the same circuitry as the pulse generation circuitry 310 in FIG. 3A by leaving input i2 open and connecting the $D_1$ input to the edge combination circuitry 340 to input i3. A lookup table 630 stores code pairs mapped to waveform values. Signal circuitry 600 is configured to access the lookup table 630 to retrieve codes and combination logic for waveform C.

The IQ pulse generation circuitry 650 includes pulse combination circuitry 660. The pulse combination circuitry combines two duty cycle signals (e.g., either I and IX or Q and QX) with the pulse signals P, P1, and P2 from the pulse generation circuitry 310 and modified pulse generation circuitries 615a, 615b to generate two LO signals (e.g., either I+ and I− or Q+ and Q−) characterized by the waveform C. Pulse combination circuitry 660 includes OR circuitry 662 configured to perform a logical OR operation on the three pulse signals P, P1, and P2 to generate a result signal that has a high value when at least one of the signals is high. The result signal R corresponds to a pulse characterized by waveform C for all four duty cycles. The pulse combination circuitry 660 also includes first AND circuitry 664 configured to perform a logical AND operation on a first duty cycle signal and the result signal to generate a first LO signal characterized by waveform C. The pulse combination circuitry 660 also includes second AND circuitry 668 configured to perform a logical AND operation on a second duty cycle signal and the result signal to generate a second LO signal characterized by waveform C.

FIG. 6D illustrates timing diagrams for signal circuitry 600 when waveform C has been selected. It can be seen in the timing diagram for waveform C that the five phase signals generated by multi-phase generator circuitry 605 are delayed by one half the oscillator period from one another. The pulse signal P output by the pulse generation circuitry 310 includes a pulse disposed in a location that corresponds to the center pulse in the LO signal I+ characterized by waveform C. The modified pulse signal P1 output by the modified pulse generation circuitry 615a includes a pulse disposed in a location that corresponds to the first pulse in the LO signal I+ characterized by waveform C. The modified pulse signal P2 output by the modified pulse generation circuitry 615b includes a pulse disposed in a location that corresponds to the third pulse in the LO signal I+.

The result signal R corresponds to a pulse characterized by waveform C for all four duty cycles. The pulse combination circuitry 660 combines the result signal with the duty cycle pulses I and IX or Q and QX to generate LO signals characterized by waveform C. Thus, the logical operation shown by pulse combination circuitry 660 in FIG. 6B is mapped to waveform C in the lookup table 630 so that when waveform C is desired, the pulse combination circuitry 660 is adapted to perform the logic illustrated in FIG. 6B.

Figure 7A:
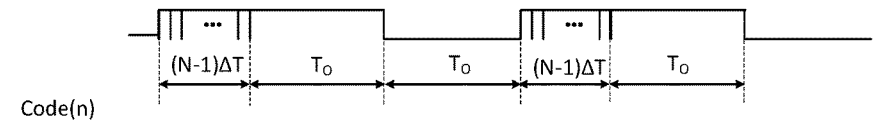
FIG. 7A illustrates a rising edge PWM concept.

In PWM transceivers, information is encoded in the pulse width of a carrier signal, rather than, or in addition to, the amplitude and phase of the carrier signal. Hence the generation of pulse-width modulated signals with high accuracy is useful in such applications. FIG. 7A illustrates how information may be encoded in the location of one of the edges (e.g., the rising edge in FIG. 7A) of a pulse in an LO signal. It can be seen that the rising edge of the pulses in the local oscillator signal are modulated so that the rising edges begin some amount of time before the pulse in an unmodulated signal (shown as the pulse width labeled $T_O$) would have begun. This results in an LO signal having pulses that are wider than pulses in the unmodulated LO signal.

The amount of time by which the pulse width deviates from the unmodulated pulse width communicates information (e.g., a symbol mapped to the number of time increments $\Delta T$ by which the rising edge leads the unmodulated pulse). The pulse has a maximum width of $(N-1)\Delta T+T_O$ and the modulation of the edge occurs during the $(N-1)\Delta T$ interval, so that the period of the PWM signal is $2T_O+(N-1)\Delta T$ regardless of the amount of time by which the pulse width deviates from the unmodulated pulse width. In other embodiments, the location of the falling edge of the pulse is modulated to encode information. The circuitry used to generate a falling edge PWM signal is analogous to the circuitry described below for rising edge PWM signals. In one embodiment, the PWM signal is used as a PWM RF signal to be transmitted by a transceiver.

Figure 7B:
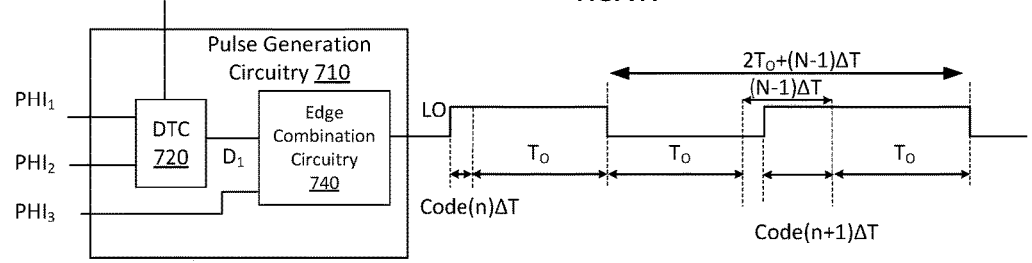
FIG. 7B illustrates one embodiment of pulse generation circuitry configured to generate a local oscillator signal according to single edge PWM.
Figure 7C:
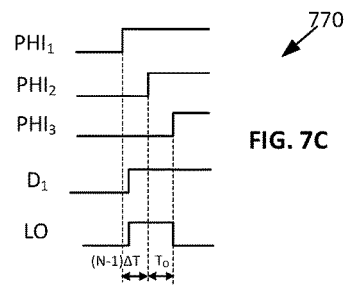
FIG. 7C illustrates a timing diagram of the local oscillator signal circuitry of FIG. 7A.

FIG. 7B illustrates pulse generation circuitry 710 configured to generate a rising edge PWM LO signal. The pulse generation circuitry 710 includes edge generation circuitry 720 that includes a DTC that generates a rising edge for a pulse from two phases $PHI_1$ and $PHI_2$ as described with respect to FIG. 2A. Edge combination circuitry combines the edge D1 produced by the DTC with a third phase $PHI_3$ to generate the PWM signal as shown in the timing diagram 770 of FIG. 7C. The amount of time by which the rising edge of the modulated pulse leads the unmodulated pulse is a number (ranging between 0 and N−1) of time increments $\Delta T$. The number of time increments is controlled by the code that is input to the DTC. In one embodiment, $\Delta T$ corresponds to a quantization resolution of the DTC. A series of codes code(n), code(n+1), and so on is input to the pulse generation circuitry so that each pulse may have its own individually controlled width as shown in FIG. 7B.

In one embodiment, the pulse generation circuitry 710 includes a lookup table similar to lookup table 430. The lookup table maps a code to the information being communicated by locating the pulse edge at the edge location produced by the code. Thus, if a certain symbol is communicated by modulating the edge 5 time increments ahead of the unmodulated edge, that symbol would be mapped to a code that would produce a pulse edge at 5 time increments prior to the unmodulated edge.

Figure 8A:
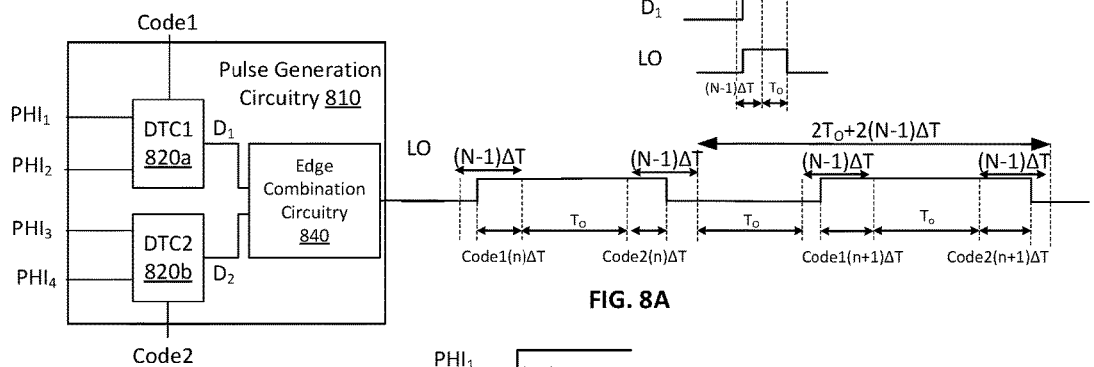
FIG. 8A illustrates one embodiment of pulse generation circuitry configured to generate a local oscillator signal according to double edge PWM.
Figure 8B:
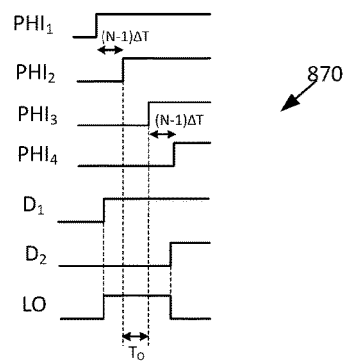
FIG. 8B illustrates a timing diagram of the local oscillator signal circuitry of FIG. 8A.

FIG. 8A illustrates pulse generation circuitry 810 that is configured to generate a double edge PWM in which the rising edge and the falling edge of the pulses are modulated to encode information. The pulse generation circuitry 810 includes two DTCs 820a, 820b, that are controlled by a first code (code1) and a second code (code2), respectively, to generate a rising pulse edge signal D1 and a falling pulse edge signal D2, respectively, as described in FIG. 2A. Note that the pulse generation circuitry 810 differs from pulse generation circuitry 310 because in pulse generation circuitry 810 there is no overlap in the phase signals that are input to the two DTCs. Edge combination circuitry 840 performs an XOR operation on the pulse edge signals D1 and D2 to generate the PWM LO signal in which the rising edge and falling edge of each pulse is modulated individually as shown in FIG. 8A and timing diagram 870 of FIG. 8B. In one embodiment, the PWM signal is used as an RF PWM signal to be transmitted by a transceiver.

In one embodiment, the pulse generation circuitry 810 includes a lookup table similar to lookup table 430. The lookup table maps a code to the information being communicated by locating the pulse edge at the edge location produced by the code. Thus, if a certain symbol is communicated by modulating the leading pulse edge 8 time increments ahead of the unmodulated leading edge and modulating the falling pulse edge 11 time increments after the unmodulated falling edge, that symbol would be mapped to a first code that would produce a leading pulse edge at 8 time increments prior to the unmodulated edge and a second code that would produce a pulse edge at 11 time increments after the unmodulated falling edge.

Figure 9A:
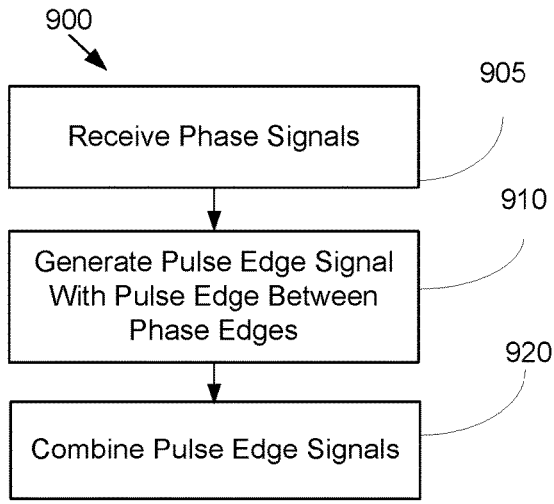
FIGS. 9A and 9B illustrate flowcharts that outline methods for using digital-to-time converters (DTCs) to generate a LO signal pulse series, according to various embodiments of the disclosure.

FIG. 9A depicts a flowchart outlining one embodiment of a method 900 that generates a pulse signal having pulses of selected width at selected locations. The method 900 may be performed by pulse generation circuitry 110, 310, 410, 710, and/or 810 of FIGS. 1-8. The method includes, at 905 inputting a first phase signal that includes a first phase edge and a second phase signal that includes a second phase edge.

In one embodiment, the first phase signal and the second phase signal are in fixed relationship to one another. At 910 the method includes generating a first pulse edge signal comprising a first pulse edge at a selected location between the first phase edge and the second phase edge, wherein an edge is a transition between signal values. Operations 905 and 910 are performed by a DTC, such as a DCEI. At 920, the first pulse edge signal and a second pulse edge signal including a second pulse edge are combined to generate the pulse signal. In one embodiment, the pulse signal is provided to circuitry configured to generate signals for transmission by a transmitter.

Figure 9B:
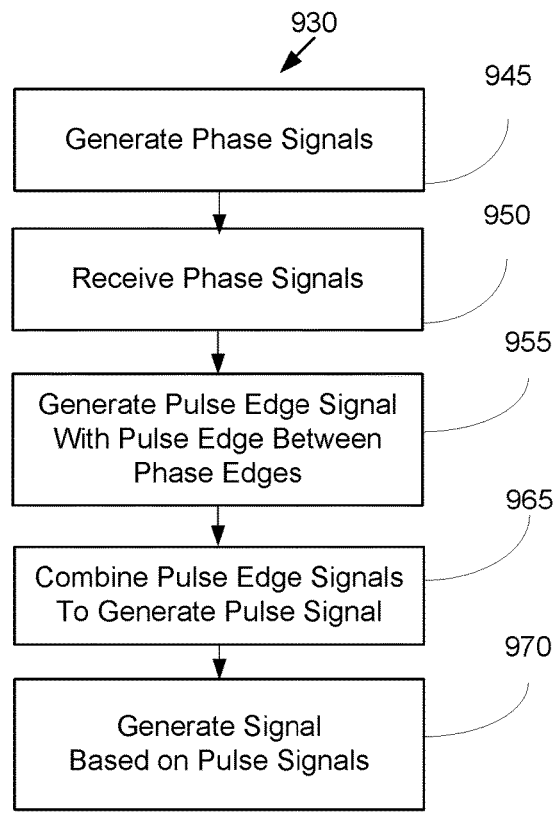

FIG. 9B depicts a flowchart outlining one embodiment of a method 930 that generates a signal based on two or more pulse signals. The method 930 may be performed by signal circuitry 400, 500, and/or 600 of FIGS. 1-8. At 945 the method includes generating a plurality of phase signals having respective phase edges. The phase signals are in fixed relationship to one another. Operation 945 may be performed by multi-phase generator circuitry 505 of FIG. 5 or multi-phase generator circuitry 605 of FIG. 6. At 950 the method includes receiving a first phase signal that includes a first phase edge and a second phase signal that includes a second phase edge. A first pulse edge signal is generated that includes a first pulse edge at a first selected location between the first phase edge and the second phase edge 955. Operations 950 and 955 are performed by a DTC, such as a DCEI. The first pulse edge signal is combined with a second pulse edge signal including a second pulse edge to generate a first pulse signal at 965. At 970, the method includes generating the signal based at least on the pulse signal and at least one other signal. In one embodiment, the method includes providing the signal to a transmitter for transmission.

It can be seen from the foregoing description that DTC based pulse generation circuitry provides flexibility and precise control when generating pulses. In one embodiment, pulse width and location can be controlled with sub-picosecond accuracy. The control code provided to the DTC that generates pulse edge signals may be changed during operation of signal circuitry to change the position of the rising edge and/or falling edge of a pulse. The combination circuitry that combines pulses from the DTC based pulse generation circuitry and other sources may be adapted to generate different waveforms for use as local oscillator signals or PWM signals.

Figure 10:
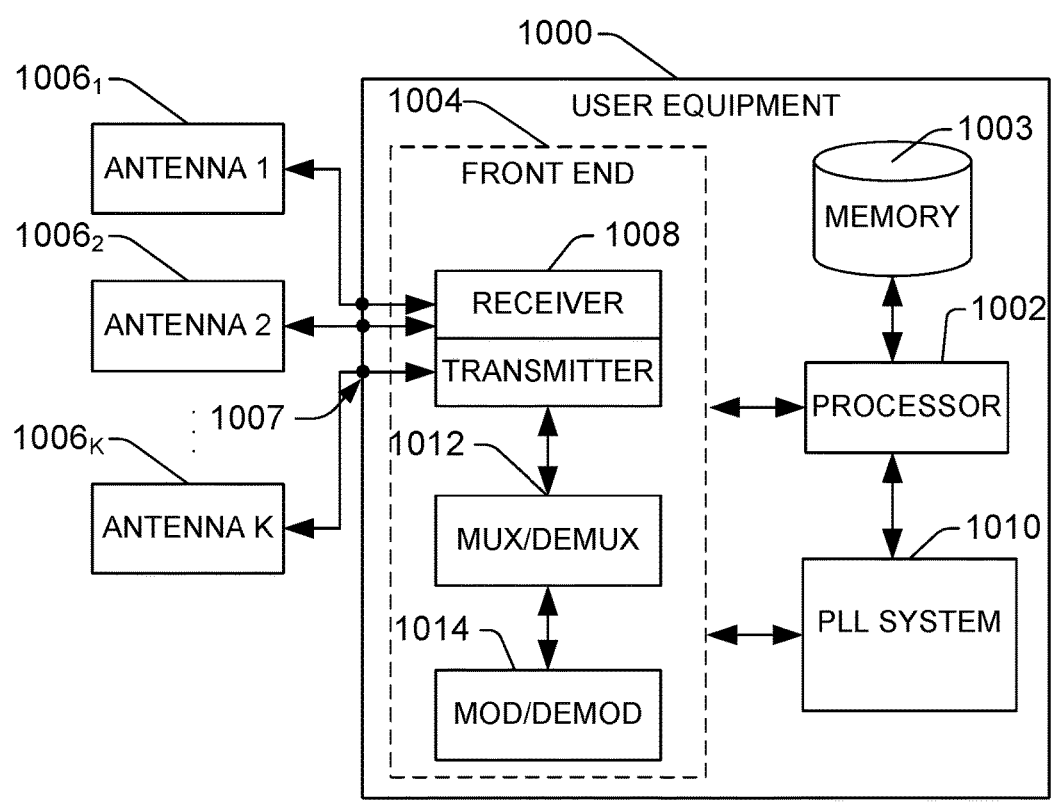
FIG. 10 illustrates an example user equipment device that includes a transceiver front end that utilizes DTC based pulse generation, according to one embodiment of the disclosure.

To provide further context for various aspects of the disclosed subject matter, FIG. 10 illustrates a block diagram of an embodiment of user equipment 1000 (e.g., a mobile device, communication device, personal digital assistant, etc.) related to access of a network (e.g., base station, wireless access point, femtocell access point, and so forth) that can enable and/or exploit features or aspects of the disclosed aspects.

The user equipment or mobile communication device 1000 can be utilized with one or more aspects of the DTC based pulse generation techniques described herein according to various aspects. The user equipment device 1000, for example, comprises a digital baseband processor 1002 that can be coupled to a data store or memory 1003, a front end 1004 (e.g., an RF front end, an acoustic front end, or the other like front end) and a plurality of antenna ports 1007 for connecting to a plurality of antennas $1006_1$ to $1006_K$ (K being a positive integer). The antennas $1006_1$ to $1006_K$ can receive and transmit signals to and from one or more wireless devices such as access points, access terminals, wireless ports, routers and so forth, which can operate within a radio access network or other communication network generated via a network device (not shown).

The user equipment 1000 can be a radio frequency (RF) device for communicating RF signals, an acoustic device for communicating acoustic signals, or any other signal communication device, such as a computer, a personal digital assistant, a mobile phone or smart phone, a tablet PC, a modem, a notebook, a router, a switch, a repeater, a PC, network device, base station or a like device that can operate to communicate with a network or other device according to one or more different communication protocols or standards.

The front end 1004 can include a communication platform, which comprises electronic components and associated circuitry that provide for processing, manipulation or shaping of the received or transmitted signals via one or more receivers or transmitters (e.g. transceivers) 1008, a mux/demux component 1012, and a mod/demod component 1014. The mod/demod component 1014 and/or the mux/demux component 1012 may be configured to generate pulses as described herein. The front end 1004 is coupled to the digital baseband processor 1002 and the set of antenna ports 1007, in which the set of antennas $1006_1$ to $1006_K$ can be part of the front end. In one aspect, the user equipment device 1000 can comprise a phase locked loop system 1010.

The processor 1002 can confer functionality, at least in part, to substantially any electronic component within the mobile communication device 1000, in accordance with aspects of the disclosure. As an example, the processor 1002 can be configured to execute, at least in part, executable instructions that select one or more codes that will cause the desired pulse signal to be generated as disclosed in FIGS. 1-9. Thus the processor 1002 may embody various aspects of the pulse generation circuitry 110, 310, 410, 710, 810 and/or the signal circuitry 400 of FIGS. 2-9, as a multi-mode operation chipset that generates pulse based signals.

The processor 1002 is functionally and/or communicatively coupled (e.g., through a memory bus) to memory 1003 in order to store or retrieve information necessary to operate and confer functionality, at least in part, to communication platform or front end 1004, the phase locked loop system 1010 and substantially any other operational aspects of the phase locked loop system 1010. The phase locked loop system 1010 includes at least one oscillator (e.g., a VCO, DCO or the like) that can be calibrated via core voltage, a coarse tuning value, signal, word or selection process.

The processor 1002 can operate to enable the mobile communication device 1000 to process data (e.g., symbols, bits, or chips) for multiplexing/demultiplexing with the mux/demux component 1012, or modulation/demodulation via the mod/demod component 1014, such as implementing direct and inverse fast Fourier transforms, selection of modulation rates, selection of data packet formats, inter-packet times, etc. Memory 1003 can store data structures (e.g., metadata), code structure(s) (e.g., modules, objects, classes, procedures, or the like) or instructions, network or device information such as policies and specifications, attachment protocols, code sequences for scrambling, spreading and pilot (e.g., reference signal(s)) transmission, frequency offsets, cell IDs, and other data for detecting and identifying various characteristics related to RF input signals, a power output or other signal components during power generation. In one embodiment, memory 1003 stores one or more lookup tables that map codes and combination circuitry to harmonic suppressing LO waveforms to be produced by signal generation circuitry as described in FIGS. 4-6.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is pulse generation circuitry that includes edge generation circuitry and edge combination circuitry. The edge generation circuitry includes a digital-to-time converter (DTC) configured to i) receive a first phase signal comprising a first phase edge and a second phase signal comprising a second phase edge and ii) generate a first pulse edge signal including a first pulse edge at a selected location between the first phase edge and the second phase edge. The edge combination circuitry is configured to combine the first pulse edge signal and a second pulse edge signal to generate a pulse signal.

Example 2 includes the subject matter of example 1, including or omitting optional elements, wherein the first DTC is configured to: input a code word that specifies a relative position between the first phase edge and the second phase edge, and generate the first pulse edge at a location between the first phase edge and the second phase edge corresponding to the position specified by the code word.

Example 3 includes the subject matter of examples 1 and 2, including or omitting optional elements, wherein the second pulse edge signal includes a third phase signal having a fixed relationship with respect to the first phase signal and the second phase signal.

Example 4 includes the subject matter of examples 1 and 2, including or omitting optional elements, wherein the edge generation circuitry includes an additional DTC configured to i) input the second phase signal and a third phase signal comprising a third phase edge and ii) generate the second pulse comprising a second pulse edge positioned at a second selected location between the second phase edge and the third phase edge.

Example 5 includes the subject matter of examples 1 and 2, including or omitting optional elements, wherein the edge combination circuitry includes an exclusive OR (XOR) circuitry configured to generate the pulse signal by performing a logical XOR operation on the first pulse edge signal and the second pulse edge signal.

Example 6 is signal generation circuitry configured to generate a signal that includes multi-phase generator circuitry, first pulse generation circuitry; and pulse combination circuitry. The multi-phase generator circuitry is configured to generate a plurality of phase signals having respective phase edges, wherein the phase signals are in fixed relationship to one another. The first pulse generation circuitry includes edge generation circuitry including a digital-to-time converter (DTC) configured to i) receive, from the multi-phase generator circuitry, a first phase signal comprising a first phase edge and a second phase signal comprising a second phase edge and ii) generate a first pulse edge signal comprising a first pulse edge at a first selected location between the first phase edge and the second phase edge; and edge combination circuitry configured to receive the first pulse edge signal and combine the first pulse edge signal and a second pulse edge signal to generate a first pulse signal. The pulse combination circuitry is configured to generate the signal based at least on the first pulse signal and at least one other signal.

Example 7 includes the subject matter of example 7, including or omitting optional elements, wherein the edge generation circuitry includes an additional DTC configured to i) receive the second phase signal and a third phase signal, wherein the third phase signal includes a third phase edge and ii) generate the second pulse edge signal comprising a second pulse edge positioned at a second selected location between the second phase edge and the third phase edge; and the edge combination circuitry is configured to generate the pulse signal by performing a logical exclusive OR (XOR) operation on the first pulse edge signal and the second pulse edge signal such that the pulse signal includes a pulse having a rising edge at the first selected location and a falling edge at the second selected location.

Example 8 includes the subject matter of example 7, including or omitting optional elements, wherein the pulse combination circuitry is configured to perform a logical exclusive OR (XOR) operation on the pulse signal and a duty cycle signal.

Example 9 includes the subject matter of example 7, including or omitting optional elements, wherein the pulse combination circuitry is configured to perform, on the pulse signal and a duty cycle signal, a logical gated exclusive OR (XOR) operation on the duty cycle signal and the pulse signal, where the duty cycle signal includes a gating signal for the gated XOR operation.

Example 10 includes the subject matter of example 7, including or omitting optional elements, wherein the signal includes a first signal and a second signal, the signal circuitry further including second pulse generation circuitry and third pulse generation circuitry. The second pulse generation circuitry includes a third DTC configured to i) receive the first phase signal and the second phase signal and ii) generate a third pulse edge signal comprising a third pulse edge positioned at a third selected location between the first pulse edge and the second pulse edge; second edge combination circuitry configured to perform a logical exclusive OR (XOR) operation on the third pulse signal and the first phase signal to generate a second pulse signal. The third pulse generation circuitry includes a fourth DTC configured to i) receive the second phase signal and the third phase signal and ii) generate a fourth pulse edge signal comprising a fourth pulse edge positioned at a fourth selected location between the second pulse edge and the third pulse edge. Third edge combination circuitry is configured to perform a logical exclusive OR (XOR) operation on the fourth pulse signal and the third phase signal to generate a third pulse signal. The pulse combination circuitry includes OR circuitry configured to perform a logical OR operation on the first pulse signal, the second pulse signal, and the third pulse signal to generate a result signal; first AND circuitry configured to perform a logical AND operation on the result signal and a first duty cycle signal to generate the first signal; and second AND circuitry configured to perform a logical AND operation on the result signal and a second duty cycle signal to generate the second signal.

Example 11 includes the subject matter of examples 6 and 7, including or omitting optional elements, wherein the multi-phase generator circuitry is configured to generate four phase signals such that successive phase signals are delayed with respect to one another by a half period of an oscillator signal; and the edge combination circuitry is configured to perform a logical exclusive OR (XOR) operation on the pulse signal and the third phase signal to generate the second pulse signal comprising a pulse having a rising edge at the first selected location.

Example 12 includes the subject matter of examples 6 and 7, including or omitting optional elements, wherein the multi-phase generator circuitry is configured to generate four phase signals such that successive phase signals are delayed with respect to one another by a half period of a local oscillator signal; the edge generation circuitry includes a second DTC configured to i) receive a third phase signal and a fourth phase signal, wherein the third phase signal includes a third phase edge and the fourth phase signal includes a fourth phase edge and ii) generate the second pulse edge signal including a second pulse edge positioned at a second selected location between the third phase edge and the fourth phase edge; and the edge combination circuitry is configured to generate the pulse signal by performing a logical exclusive OR (XOR) operation on the first pulse edge signal and the second pulse edge signal such that the pulse signal includes a pulse having a rising edge at the first selected location and a falling edge at the second selected location.

Example 13 is a method including, with a digital to time converter (DTC), receiving a first phase signal that includes a first phase edge and a second phase signal that includes a second phase edge; generating a first pulse edge signal including a first pulse edge at a selected location between the first phase edge and the second phase edge; receiving the first pulse edge signal and a second pulse edge signal that includes a second pulse edge; and combining the first pulse edge signal and the second pulse edge signal to generate a pulse signal.

Example 14 includes the subject matter of example 13, including or omitting optional elements, further including receiving a code word that specifies a relative position between the first phase edge and the second phase edge, and generating the pulse edge at a location between the first phase edge and the second phase edge corresponding to the position specified by the code word.

Example 15 includes the subject matter of examples 13 and 14, including or omitting optional elements, wherein the second pulse edge signal includes a third phase signal having a fixed relationship with respect to the first phase signal and the second phase signal.

Example 16 includes the subject matter of examples 13 and 14, including or omitting optional elements, further including receiving the second phase signal and a third phase signal including a third phase edge; and generating the second pulse signal including a second pulse edge positioned at a second selected location between the second phase edge and the third phase edge.

Example 17 includes the subject matter of examples 13 and 14, including or omitting optional elements, further including generating the pulse signal by performing a logical exclusive OR (XOR) operation on the first pulse edge signal and the second pulse edge signal.

Example 18 is a method configured to generate a signal, including generating a plurality of phase signals having respective phase edges; receiving a first phase signal that includes a first phase edge and a second phase signal that includes a second phase edge; generating a first pulse edge signal including a first pulse edge at a first selected location between the first phase edge and the second phase edge; combining the first pulse edge signal and a second pulse edge signal including a second pulse edge to generate a first pulse signal; and generating the signal based at least on the first pulse signal and at least one other signal.

Example 19 includes the subject matter of example 17, including or omitting optional elements, including receiving the second phase signal and a third phase signal including a third phase edge; generating the second pulse edge including a second pulse edge positioned at a second selected location between the second phase edge and the third phase edge; and generating the pulse signal by performing a logical XOR operation on the first pulse edge signal and the second pulse edge signal such that the pulse signal includes a pulse having a rising edge at the first selected location and a falling edge at the second selected location.

Example 20 includes the subject matter of example 19, including or omitting optional elements, including performing a logical exclusive OR (XOR) operation on the pulse signal and a duty cycle signal.

Example 21 includes the subject matter of example 19, including or omitting optional elements, including performing, on the pulse signal and a duty cycle signal, a logical operation corresponding to a positive edge set-reset flip flop, where the duty cycle signal includes the set input of the flip flop and the pulse signal includes the reset input of the flip flop.

Example 22 includes the subject matter of example 19, including or omitting optional elements, wherein the signal includes a first signal and a second signal, and including receiving the first phase signal and the second phase signal; generating a third pulse edge signal including a third pulse edge positioned at a third selected location between the first pulse edge and the second pulse edge; performing a logical exclusive OR (XOR) operation on the third pulse signal and the first phase signal to generate a second pulse signal; receiving the second phase signal and the third phase signal; generating a fourth pulse edge signal including a fourth pulse edge positioned at a fourth selected location between the second pulse edge and the third pulse edge; performing a logical exclusive OR (XOR) operation on the fourth pulse signal and the third phase signal to generate a third pulse signal; and performing a logical OR operation on the first pulse signal, the second pulse signal, and the third pulse signal to generate a result signal; performing a logical AND operation on the result signal and a first duty cycle signal to generate the first signal; and performing a logical AND operation on the result signal and a second duty cycle signal to generate the second signal.

Example 23 includes the subject matter of examples 18 and 19, including or omitting optional elements, including generating four phase signals such that successive phase signals are delayed with respect to one another by a half period of a local oscillator signal; and performing a logical exclusive OR (XOR) operation on the pulse signal and the third phase signal to generate the second pulse signal such that the pulse signal includes a pulse having a rising edge at the first selected location.

Example 24 includes the subject matter of examples 18 and 19, including or omitting optional elements, including generating four phase signals such that successive phase signals are delayed with respect to one another by a half period of an oscillator signal; and receiving a third phase signal and a fourth phase signal, wherein the third phase signal includes a third phase edge and the fourth phase signal includes a fourth phase edge; generating the second pulse edge signal including a second pulse edge positioned at a second selected location between the third phase edge and the fourth phase edge; and generating the pulse signal by performing a logical exclusive OR (XOR) operation on the first pulse edge signal and the second pulse edge signal such that the pulse signal includes a pulse having a rising edge at the first selected location and a falling edge at the second selected location.

Example 25 is an apparatus, including means for receiving a first phase signal that includes a first phase edge and a second phase signal that includes a second phase edge; means for generating a first pulse edge signal including a first pulse edge at a selected location between the first phase edge and the second phase edge, and means for combining the first pulse edge signal and a second pulse edge signal including a second pulse edge to generate a pulse signal.

Example 26 includes the subject matter of example 25, including or omitting optional elements, including means for receiving a code word that specifies a relative position between the first phase edge and the second phase edge, and means for generating the pulse edge at a location between the first phase edge and the second phase edge corresponding to the position specified by the code word.

Example 27 is an apparatus configured to generate a signal, including means for generating a plurality of phase signals having respective phase edges; means for receiving a first phase signal that includes a first phase edge and a second phase signal that includes a second phase edge; means for generating a first pulse edge signal including a first pulse edge at a first selected location between the first phase edge and the second phase edge; and means for combining the first pulse edge signal and a second pulse edge signal including a second pulse edge to generate a first pulse signal; and means for generating the signal based at least on the first pulse signal and at least one other signal.

Example 28 includes the subject matter of examples 18 and 19, including or omitting optional elements, including means for inputting the second phase signal and a third phase signal, wherein the third phase signal includes a third phase edge; means for generating the second pulse edge signal including a second pulse edge positioned at a second selected location between the second phase edge and the third phase edge; and means for generating the pulse signal by performing a logical XOR operation on the first pulse edge signal and the second pulse edge signal such that the pulse signal includes a pulse having a rising edge at the first selected location and a falling edge at the second selected location.

The foregoing description of one or more implementations provides illustration and description, but is not intended to be exhaustive or to limit the scope of the example embodiments to the precise form disclosed. Modifications and variations are possible in light of the above teachings or may be acquired from practice of various implementations of the example embodiments.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

The present disclosure will now be described with reference to the attached figures, wherein like reference numerals are used to refer to like elements throughout, and wherein the illustrated structures and devices are not necessarily drawn to scale. As utilized herein, terms "module", "component," "system," "circuit," "circuitry," "element," "slice," and the like are intended to refer to a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuitries can reside within a process, and circuitry can be localized on one computer and/or distributed between two or more computers. A set of elements or a set of other circuitry can be described herein, in which the term "set" can be interpreted as "one or more."

As another example, circuitry or similar term can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, circuitry can be an apparatus that provides specific functionality through electronic components without mechanical parts; the electronic components can include one or more processors therein to execute software and/or firmware that confer(s), at least in part, the functionality of the electronic components.

It will be understood that when an element is referred to as being "electrically connected" or "electrically coupled" to another element, it can be physically connected or coupled to the other element such that current and/or electromagnetic radiation can flow along a conductive path formed by the elements. Intervening conductive, inductive, or capacitive elements may be present between the element and the other element when the elements are described as being electrically coupled or connected to one another. Further, when electrically coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

Use of the word exemplary is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

The invention claimed is:

1. Pulse generation circuitry, comprising:
   edge generation circuitry comprising a digital-to-time converter (DTC) configured to i) receive a first phase signal comprising a first phase edge and a second phase signal comprising a second phase edge and ii) generate a first pulse edge signal comprising a first pulse edge at a selected location between the first phase edge and the second phase edge; and
   edge combination circuitry configured to combine the first pulse edge signal and a second pulse edge signal to generate a pulse signal.

2. The pulse generation circuitry of claim 1, wherein the DTC is configured to:
   input a code word that specifies a relative position between the first phase edge and the second phase edge, and
   generate the first pulse edge at a location between the first phase edge and the second phase edge corresponding to the relative position specified by the code word.

3. The pulse generation circuitry of claim 1, wherein the second pulse edge signal comprises a third phase signal having a fixed relationship with respect to the first phase signal and the second phase signal.

4. The pulse generation circuitry of claim 1, wherein the edge generation circuitry comprises an additional DTC configured to i) receive the second phase signal and a third phase signal comprising a third phase edge and ii) generate the second pulse edge signal comprising a second pulse edge positioned at a second selected location between the second phase edge and the third phase edge.

5. The pulse generation circuitry of claim 1, wherein the edge combination circuitry comprises an exclusive OR (XOR) circuitry configured to generate the pulse signal by performing a logical XOR operation on the first pulse edge signal and the second pulse edge signal.

6. Signal generation circuitry configured to generate a signal, comprising:
   multi-phase generator circuitry configured to generate a plurality of phase signals having respective phase edges, wherein the phase signals are in fixed relationship to one another;
   first pulse generation circuitry, comprising:
      edge generation circuitry comprising a digital-to-time converter (DTC) configured to i) receive, from the multi-phase generator circuitry, a first phase signal comprising a first phase edge and a second phase signal comprising a second phase edge and ii) generate a first pulse edge signal comprising a first pulse edge at a first selected location between the first phase edge and the second phase edge; and
      edge combination circuitry configured to receive the first pulse edge signal and combine the first pulse edge signal and a second pulse edge signal to generate a first pulse signal;
   pulse combination circuitry configured to generate the signal based at least on the first pulse signal and at least one other signal.

7. The signal generation circuitry of claim 6, wherein:
   the edge generation circuitry comprises an additional DTC configured to i) input the second phase signal and a third phase signal comprising a third phase edge and ii) generate the second pulse edge signal comprising a second pulse edge positioned at a second selected location between the second phase edge and the third phase edge; and
   the edge combination circuitry is configured to generate the pulse signal by performing a logical exclusive OR (XOR) operation on the first pulse edge signal and the second pulse edge signal such that the pulse signal includes a pulse having a rising edge at the first selected location and a falling edge at the second selected location.

8. The signal circuitry of claim 7, wherein the pulse combination circuitry is configured to perform a logical exclusive OR (XOR) operation on the pulse signal and a duty cycle signal.

9. The signal circuitry of claim 7, wherein the pulse combination circuitry is configured to perform, on the pulse signal and a duty cycle signal, a logical gated exclusive OR (XOR) operation on the duty cycle signal and the pulse signal, where the duty cycle signal comprises a gating signal for the gated XOR operation.

10. The signal circuitry of claim 7, wherein the signal comprises a first signal and a second signal, the signal circuitry further comprising:
   second pulse generation circuitry comprising:
      a third DTC configured to i) receive the first phase signal and the second phase signal and ii) generate a third pulse edge signal comprising a third pulse edge positioned at a third selected location between the first pulse edge and the second pulse edge;
      second edge combination circuitry configured to perform a logical exclusive OR (XOR) operation on the third pulse signal and the first phase signal to generate a second pulse signal;
   third pulse generation circuitry comprising:
      a fourth DTC configured to i) receive the second phase signal and the third phase signal and ii) generate a fourth pulse edge signal comprising a fourth pulse edge positioned at a fourth selected location between the second pulse edge and the third pulse edge;
      third edge combination circuitry configured to perform a logical exclusive OR (XOR) operation on the fourth pulse signal and the third phase signal to generate a third pulse signal; and
   wherein the pulse combination circuitry comprises:
      OR circuitry configured to perform a logical OR operation on the first pulse signal, the second pulse signal, and the third pulse signal to generate a result signal;
      first AND circuitry configured to perform a logical AND operation on the result signal and a first duty cycle signal to generate the first signal; and second AND circuitry configured to perform a logical AND operation on the result signal and a second duty cycle signal to generate the second signal.

11. The signal generation circuitry of claim 6, wherein:
the multi-phase generator circuitry is configured to generate four phase signals such that successive phase signals are delayed with respect to one another by a half period of an oscillator signal; and
the edge combination circuitry is configured to perform a logical exclusive OR (XOR) operation on the first pulse signal and a third phase signal to generate a second pulse signal comprising a pulse having a rising edge at the first selected location.

12. The signal generation circuitry of claim 6, wherein:
the multi-phase generator circuitry is configured to generate four phase signals such that successive phase signals are delayed with respect to one another by a half period of a local oscillator signal; and
the edge generation circuitry comprises an additional DTC configured to i) receive a third phase signal and a fourth phase signal, wherein the third phase signal comprises a third phase edge and the fourth phase signal comprises a fourth phase edge and ii) generate the second pulse edge signal comprising a second pulse edge positioned at a second selected location between the third phase edge and the fourth phase edge; and
the edge combination circuitry is configured to generate the first pulse signal by performing a logical exclusive OR (XOR) operation on the first pulse edge signal and the second pulse edge signal such that the first pulse signal comprises a pulse having a rising edge at the first selected location and a falling edge at the second selected location.

13. A method, comprising, with a digital to time converter (DTC):
receiving a first phase signal that includes a first phase edge and a second phase signal that includes a second phase edge;
generating a first pulse edge signal comprising a first pulse edge at a selected location between the first phase edge and the second phase edge; and
combining the first pulse edge signal and a second pulse edge signal comprising a second pulse edge to generate a pulse signal.

14. The method of claim 13, further comprising:
receiving a code word that specifies a relative position between the first phase edge and the second phase edge, and
generating the first pulse edge at a location between the first phase edge and the second phase edge corresponding to the relative position specified by the code word.

15. The method of claim 13, wherein the second pulse edge signal comprises a third phase signal having a fixed relationship with respect to the first phase signal and the second phase signal.

16. The method of claim 13, further comprising:
receiving the second phase signal and a third phase signal comprising a third phase edge; and
generating the second pulse signal comprising a second pulse edge positioned at a second selected location between the second phase edge and the third phase edge.

17. The method of claim 13, further comprising generating the pulse signal by performing a logical exclusive OR (XOR) operation on the first pulse edge signal and the second pulse edge signal.

18. A method configured to generate a signal, comprising:
generating a plurality of phase signals having respective phase edges, wherein the phase signals are in fixed relationship to one another;
receiving a first phase signal that includes a first phase edge and a second phase signal that includes a second phase edge;
generating a first pulse edge signal comprising a first pulse edge at a first selected location between the first phase edge and the second phase edge; and
receiving the first pulse edge signal and a second pulse edge signal that includes a second pulse edge;
combining the first pulse edge signal and the second pulse edge signal to generate a first pulse signal; and
generating the signal based at least on the first pulse signal and at least one other signal.

19. The method of claim 18, further comprising:
receiving the second phase signal and a third phase signal, wherein the third phase signal comprises a third phase edge;
generating the second pulse edge signal comprising a second pulse edge positioned at a second selected location between the second phase edge and the third phase edge; and
generating the pulse signal by performing a logical XOR operation on the first pulse edge signal and the second pulse edge signal such that the pulse signal includes a pulse having a rising edge at the first selected location and a falling edge at the second selected location.

20. The method of claim 19, further comprising performing a logical exclusive OR (XOR) operation on the pulse signal and a duty cycle signal.

21. The method of claim 19, further comprising performing, on the pulse signal and a duty cycle signal, a logical operation corresponding to a positive edge set-reset flip flop, where the duty cycle signal comprises the set input of the flip flop and the pulse signal comprises the reset input of the flip flop.

22. The method of claim 19, wherein the signal comprises a first signal and a second signal, the method further comprising:
receiving the first phase signal and the second phase signal;
generating a third pulse edge signal comprising a third pulse edge positioned at a third selected location between the first pulse edge and the second pulse edge;
performing a logical exclusive OR (XOR) operation on the third pulse signal and the first phase signal to generate a second pulse signal;
receiving the second phase signal and the third phase signal;
generating a fourth pulse edge signal comprising a fourth pulse edge positioned at a fourth selected location between the second pulse edge and the third pulse edge;
performing a logical exclusive OR (XOR) operation on the fourth pulse signal and the third phase signal to generate a third pulse signal; and
performing a logical OR operation on the first pulse signal, the second pulse signal, and the third pulse signal to generate a result signal;
performing a logical AND operation on the result signal and a first duty cycle signal to generate the first signal; and
performing a logical AND operation on the result signal and a second duty cycle signal to generate the second signal.

23. The method of claim 18, further comprising:
generating four phase signals such that successive phase signals are delayed with respect to one another by a half period of a local oscillator signal; and
performing a logical exclusive OR (XOR) operation on the first pulse signal and a third phase signal to generate a second pulse signal such that the second pulse signal includes a pulse having a rising edge at the first selected location.

24. The method of claim 18, further comprising:
generating four phase signals such that successive phase signals are delayed with respect to one another by a half period of an oscillator signal; and
receiving a third phase signal comprising a third phase edge and a fourth phase signal comprising a fourth phase edge;
generating the second pulse edge signal comprising a second pulse edge positioned at a second selected location between the third phase edge and the fourth phase edge; and
generating the first pulse signal by performing a logical exclusive OR (XOR) operation on the first pulse edge signal and the second pulse edge signal such that the first pulse signal includes a pulse having a rising edge at the first selected location and a falling edge at the second selected location.

* * * * *